United States Patent
Woo et al.

(10) Patent No.: US 6,548,395 B1
(45) Date of Patent: Apr. 15, 2003

(54) METHOD OF PROMOTING VOID FREE COPPER INTERCONNECTS

(75) Inventors: Christy Mei-Chu Woo, Cupertino, CA (US); Pin-Chin Connie Wang, Menlo Park, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/713,313

(22) Filed: Nov. 16, 2000

(51) Int. Cl.[7] .......................................... H01L 21/4763
(52) U.S. Cl. .................. 438/622; 438/675; 438/677; 438/625; 438/629
(58) Field of Search ................................ 438/622, 627, 438/637, 625, 629, 653, 654, 675, 677, 692

(56) References Cited

U.S. PATENT DOCUMENTS

| | | | | |
|---|---|---|---|---|
| 5,814,557 A | * | 9/1998 | Venkatraman et al. | 438/622 |
| 6,174,811 B1 | * | 1/2001 | Ding et al. | 438/627 |
| 6,184,137 B1 | * | 2/2001 | Ding et al. | 438/687 |
| 6,207,222 B1 | * | 3/2001 | Chen et al. | 427/123 |
| 6,287,968 B1 | * | 9/2001 | Yu et al. | 438/643 |

* cited by examiner

*Primary Examiner*—Olik Chaudhuri
*Assistant Examiner*—Thanh V Pham

(57) ABSTRACT

Cu or a Cu alloy is deposited to partially fill openings in a dielectric layer and then annealed. Incomplete filling leaves room in the openings to accommodate a volume change associated with grain growth and, hence, prevents the generation of voids. The openings are then completely filled, annealed a second time and then planarized, as by CMP. Embodiments include partially filling about 70% to about 90% of the volume of the trenches and then annealing before completely filling the trenches.

20 Claims, 3 Drawing Sheets

METHOD OF PROMOTING VOID FREE COPPER INTERCONNECTS

RELATED APPLICATIONS

This application contains subject matter similar to subject matter disclosed in copending U.S. patent application Ser. No. 09/713,314 filed on Nov. 16, 2000, copending U.S. patent application Ser. No. 09/593,231 filed on Jun. 14, 2000, and copending U.S. patent application Ser. No. 09/655,699 filed on Sep. 6, 2000.

FIELD OF THE INVENTION

The present invention relates to a semiconductor device comprising a high conductivity interconnect structure, and to a method of forming the high conductivity interconnect structure. The present invention is applicable to high speed integrated circuits, particularly integrated circuits having sub-micron design features.

BACKGROUND ART

As integrated circuit geometry continues to plunge into the deep sub-micron regime, it becomes increasingly difficult to satisfy the requirements of high performance microprocessor applications for rapid circuitry speed. The speed of semiconductor circuitry varies inversely with the resistance (R) and capacitance (C) of the interconnection system. The higher the value of the R×C product, the more limiting the circuit operating speed. Miniaturization requires long interconnects having small contacts and small cross-sections. Accordingly, continuing reduction of design rules into the deep sub-micron regime requires decreasing the R and C associated with interconnection paths. Thus, low resistivity interconnection paths are critical to fabricating dense, high performance devices.

One way to increase the control speed of semiconductor circuitry is to reduce the resistance of a conductive pattern. Copper (Cu) is considered a viable alternative to aluminum (Al) for metallization patterns, particularly for interconnect systems having smaller dimensions. Cu has a lower bulk resistivity and potentially higher electromigration tolerance than Al. Both the lower bulk resistivity and higher electromigration tolerance improve circuit performance. A conventional approach to forming a Cu interconnection involves the use of damascene processing in which openings are formed in an interlayer dielectric (ILD) and then filled with Cu. Such damascene techniques typically include single as well as dual damascene techniques, the latter comprising forming a via opening in communication with a trench opening and simultaneously filling by metal deposition to form a via in communication with a metal line.

However, Cu is a mid-gap impurity in silicon and silicon dioxide. Accordingly, Cu diffusion through interlayer dielectrics, such as silicon dioxide, degrades the performance of the integrated circuit. A conventional approach to the diffusion problem comprises depositing a barrier material to encapsulate the Cu line. Typically diffusion barrier materials include tantalum (Ta), tantalum nitride (TaN), titanium nitride (TiN), titanium tungsten (TiW), and silicon nitride for encapsulating Cu. The use of such barrier materials to encapsulate Cu is not limited to the interface between the Cu and the ILD, but includes interfaces with other metals as well. In depositing Cu by electroless deposition or electroplating, a seedlayer is also typically deposited to catalyze electroless deposition or to carry electric current for electroplating. For electroplating, the seedlayer must be continuous. However, for electroless plating, very thin catalytic layers can be employed in the form of eyelets.

Conventional damascene interconnect methodology involving metal deposition, including Cu deposition, typically comprises depositing a layer of metal, e.g., barrier metal/seedlayer/Cu, annealing, as at about 100° C. to about 450° C. for Cu, and then planarizing, as by chemical-mechanical polishing (CMP), such that the upper surfaces of the filled trenches are substantially coplanar with the upper surface of the ILD. A capping layer, such as silicon nitride, is then typically deposited to complete encapsulation of Cu inlaid metallization.

During such conventional damascene methodology the annealing step is conducted to relieve stress within the filled opening generated by damascene filling. However, it was found that voiding typically occurs within the filled openings, e.g., metal lines, leading to electromigration failure.

Accordingly, there exists a need for methodology enabling the fabrication of semiconductor devices comprising interconnect patterns with reduced voids and reduced electromigration failures. There exists a particular need for methodology enabling the fabrication of semiconductor devices comprising Cu interconnection patterns semiconductor devices having metal levels with varying line widths in the deep sub-micron regime.

DISCLOSURE OF THE INVENTION

An advantage of the present invention is a method of manufacturing a semiconductor device containing metallized interconnection patterns, particular Cu interconnection patterns, with lines having improved electromigration resistance and substantially no or significantly reduced voids.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a plurality of openings in a dielectric layer; depositing a layer of metal partially filling the openings; annealing to effect grain growth of the metal deposited within the openings; and depositing a layer of metal to completely fill the openings.

Embodiments of the present invention comprise forming a plurality of trenches in an ILD, depositing a layer of Cu or a Cu alloy partially filling the openings, leaving sufficient empty space within the openings to prevent the generation of voids upon subsequent annealing to effect grain growth of the Cu or Cu alloy within the partially filled trenches, and annealing at a temperature, as at about 100° C. to about 450° C., in a suitable atmosphere, such as nitrogen or a forming gas comprising nitrogen and hydrogen, to effect grain growth of the Cu or Cu alloy within the partially filled trenches. Subsequently, Cu or a Cu alloy, is deposited to completely fill the trenches and a second annealing is conducted under substantially the same conditions as the first annealing of the partially filled trenches. Subsequently, CMP is conducted to effect planarization so that the upper surfaces of the filled trenches are substantially coplanar with the upper surface of the ILD. A capping layer, such as silicon nitride, is then deposited to encapsulate the Cu or Cu alloy lines within the trenches. Embodiments include depositing a Cu or Cu alloy to fill about 70% to about 90% of the volume of the trenches before conducting the first annealing.

Additional advantages of the present invention will become readily apparent to those skilled in the art from the following detailed description, wherein embodiments of the present invention are described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 5, similar elements are denoted by similar reference numerals.

DESCRIPTION OF THE INVENTION

Figure 1:
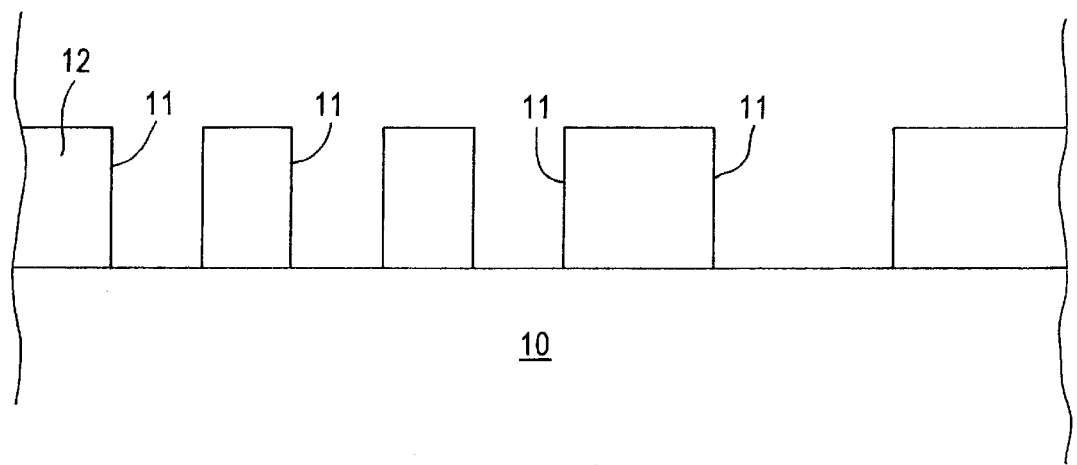
FIGS. 1 through 5 schematically illustrate sequential phases of a method in accordance with an embodiment of the present invention.

The present invention addresses and solves problems attendant upon forming metal interconnection patterns, particularly Cu interconnection patterns, having a maximum feature size in the deep sub-micron regime, as in damascene techniques, wherein a plurality of openings, e.g., trenches, are formed in a dielectric layer, e.g., an ILD, to form Cu lines having different widths. As employed herein throughout, the symbol "Cu" is intended to include substantially pure elemental Cu, Cu containing unavoidable impurities, Cu containing ingredients that were present in the plating bath used for depositing the Cu, as well as Cu alloys, such as Cu alloys containing minor amounts, e.g., up to about 5 at. %, of an element, such as tantalum, indium, tin, zinc, manganese, chromium, titanium, germanium, strontium, palladium, magnesium or zirconium.

A problem addressed and solved by the present invention is the generation of voids within metal lines, e.g., Cu lines, upon thermal cycling. Thermal annealing after metal deposition is typically performed to relieve film stress generated by damascene filling a confined region, e.g., a trench. After experimentation and investigation, it was observed that the grain growth within the filled trenches occurring upon thermal annealing was accompanied by a shrinkage in volume. It is believed that the volume decrease is due to the coalescence of smaller grains into larger grains thereby eliminating the volume occupied by the grain boundaries. It is believed that such a decrease in volume within the confines of a damascene opening, such as a trench, leads to void formation which, in turn, generates electromigration failure. Thus, the conventional practice of annealing a filled trench to relieve stresses is problematic, particularly at reduced feature sizes, in that it is quite difficult to relieve stress within a small enclosed feature.

The present invention addresses and solves that problem by depositing the metal to fill the trench in at least two different steps with intervening anneals. In an embodiment of the present invention, a metal, such as Cu, is deposited to partially fill the trenches leaving sufficient empty space such that, upon annealing, grain growth with volume change can be accommodated without void formation. In other words, the volume change of the initially deposited metal is accommodated by empty space within the partially filled trench.

After partially filling the trenches, a first annealing is conducted to effect stress relief, i.e., grain growth and with an attendant change in volume. However, because of the empty space in each unfilled trench, the volume change is accommodated without the generation of voids. Subsequently, another layer of metal is deposited to completely fill the trenches, followed by a second annealing and then planarization, as by CMP.

Embodiments of the present invention comprise forming a plurality of trenches in an ILD, such as a silicon oxide ILD or an ILD comprising a dielectric material having a low dielectric constant, e.g., dielectric constant less than about 3.9, and then depositing a barrier layer, such as tantalum or tantalum nitride lining the openings. A seedlayer, such as an alloy of Cu, is then deposited on the barrier layer. A Cu layer is then deposited, as by electroplating, to partially fill the openings, such as by filling between about 70% to about 90% of the volume of the trenches. Annealing is then conducted, as at a temperature of about 100° C. to about 450° C., in a suitable atmosphere, such as an atmosphere containing nitrogen or an atmosphere containing a forming gas which is a mixture of nitrogen and hydrogen. At this point, during annealing grain growth is promoted to relieve the Cu film stress. The attendant change in volume within the trenches is accommodated by the empty space remaining because the trenches are only partially filled. Subsequently, Cu is deposited to completely fill the trenches, as by electroplating. A second annealing step is then conducted, as at a temperature of about 100° C. to about 450° C. in an appropriate atmosphere, such as an atmosphere containing nitrogen or an atmosphere containing a forming gas. Planarization is then implemented, as by CMP. A capping layer, such as silicon nitride, is then deposited to encapsulate the Cu metallization.

In implementing embodiments of the present invention, substantially pure copper or a copper alloy can be initially deposited to partially fill the trenches before implementing the first annealing, and substantially pure copper or a copper alloy can be deposited after the first annealing to completely fill the trenches. The substantially pure copper or copper alloy deposited to completely fill the trenches need not correspond to the same copper material employed when partially filling the trenches. For example, substantially pure copper can be deposited to partially fill the trench and a copper alloy can be deposited to completely fill the trench. In addition, different copper alloys can be deposited to partially fill the trenches and to completely fill the trenches. Suitable copper alloys used in practicing the present invention include those containing elements which improve the electromigration resistance of copper, such as tin, zirconium, strontium, palladium, magnesium, chromium and tantalum.

Metal levels generally contain a plurality of metal lines having a different widths. Accordingly, in implementing damascene technology, a plurality of trenches are formed with different widths. For example, trenches may be formed having a width of about 0.15 micron to about 10 microns. Manifestly, the amount of metal present in the interconnection line is directly proportioned to the width of the line, relatively wider lines requiring more metal then relatively narrower lines. Therefore, in embodiments of the present invention, the amount of empty space remaining in each trench after partially filling the trenches will vary, with the wider trenches containing more empty space.

In implementing the annealing steps in accordance with embodiments of the present invention, the anneal cycle temperature can range from about 100° C. to about 450° C. for about 2 minutes to about 1 hour. Annealing can be conducted in an atmosphere containing nitrogen, a forming gas comprising about 1 to about 4 vol. % hydrogen and the balance nitrogen, or in a mixture of nitrogen, hydrogen and helium. The strategic implementation of an anneal after partially filling the trenches, e.g., filling about 70% to about 95% of the volume of the trenches, substantially prevents or significantly reduces the formation of voids in lines, thereby reducing electromigration failure.

When forming interconnection patterns, a capping layer, such as silicon nitride, is deposited to prevent Cu from diffusing into the next dielectric layer. Suitable capping materials also include silicon oxynitride or a low dielectric constant material, such as BLOK™ available from Applied Materials in Santa Clara, Calif.

In implementing embodiments of the present invention, metallization can be deposited by various techniques, such as electrodeposition or electroless plating. Typically, a conventional barrier layer and/or a seedlayer is initially deposited before filling the trenches. The initial deposition of Cu to partially fill the trenches can be implemented by a conventional conformal- or a conventional preferential filling- type technique. Conformal filling can be implemented by electroplating, electroless plating and chemical vapor deposition techniques. Preferential filling can be implemented employing a conventional electroplating technique with bottom-enhanced filling chemistry and plating process controlled.

In implementing embodiments of the present invention, the dielectric layer, e.g., ILD, can comprise any conventional dielectric material employed in the manufacture of semiconductor devices, including any of various of silicon oxides and low dielectric constant materials, including polymers. Suitable low dielectric constant materials include FLARE 2.0™ dielectric, a poly(arylene)ether available from Allied Signal Advanced Micro Electronic Materials, Sunnyvale, Calif., BCB (divinylsiloxane bis-benzocyclobutene) and SILK™, an organic polymer similar to BCB, both available from Dow Chemical Co., Middleton, Mich., and silicon-carbon-oxygen-hydrogen (SiCOH) organic dielectrics, such as BLACK DIAMOND™ dielectric available from Applied Material in Santa Clara, Calif.

Figure 2:
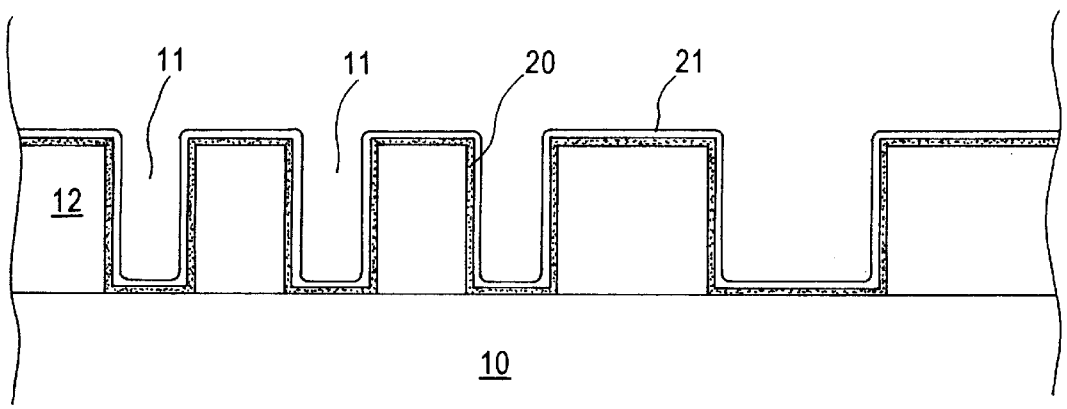

An embodiment of the present invention is schematically illustrated in FIGS. 1 through 5 wherein similar features are denoted by similar reference numerals. Adverting to FIG. 1, a plurality of trenches 11 are formed in ILD 10 containing metal features (not shown for illustrative convenience). As shown in FIG. 2, a barrier layer 20 is deposited, such as tantalum or tantalum nitride, lining each trench opening. A seedlayer 21, is then deposited. Typical seedlayers include Cu alloys containing magnesium, aluminum, zinc, zirconium, tin, nickel, palladium, silver or gold in a suitable amount, e.g., about 0.3 to about 12 at. %.

Figure 3:
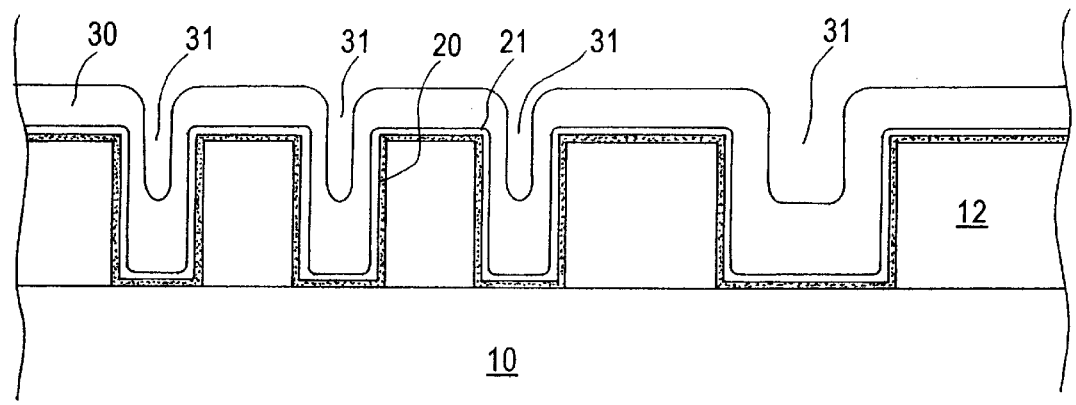

Adverting to FIG. 3, a first Cu layer deposition is implemented, as by electroplating, to partially fill the trenches with a first Cu layer 30 leaving empty spaces 31 in the trenches, the empty spaces varying in size depending upon the width of the trenches 11 (FIG. 2). At this point, a first annealing is conducted to effect stress relief by grain growth of first Cu layer 30. The presence of empty spaces 31 within the partially filled trenches permits volume change of the first Cu layer 30 during grain growth without generating voids or with a significant reduction in the amount of voids that would otherwise occur upon annealing a completely filled trench, thereby ultimately reducing electromigration failures of the resulting metal lines. Such grain growth is schematically illustrated in FIG. 4 by reference numeral 40.

Figure 4:
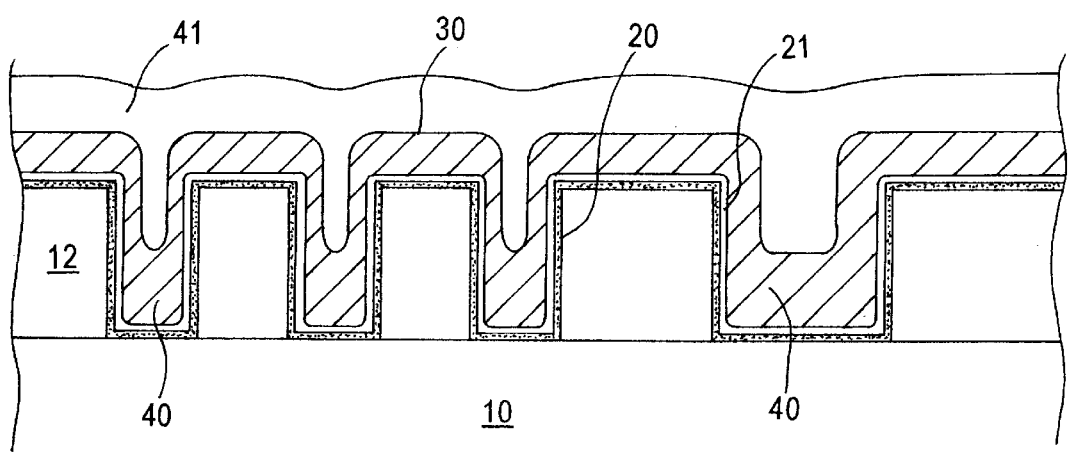
Figure 5:
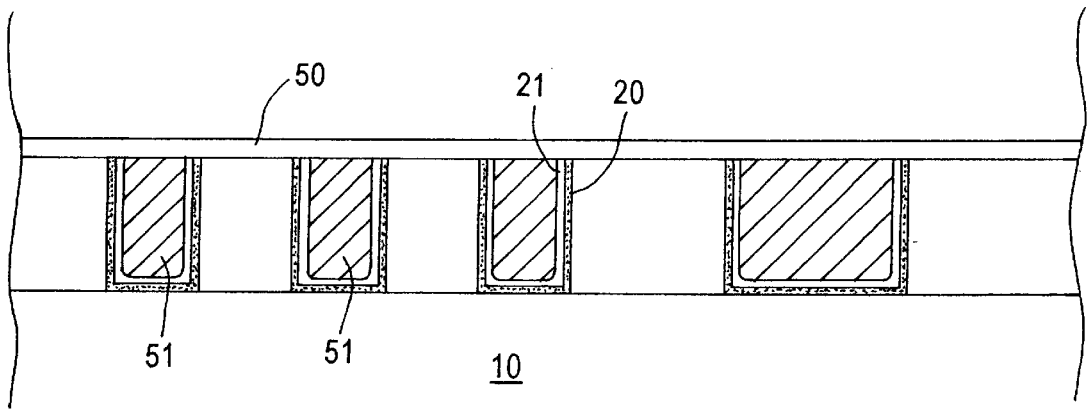

As also shown in FIG. 4, a second Cu layer 41 is deposited to completely fill the remaining empty spaces 31 (FIG. 3) of the trenches 11 (FIG. 2). Another annealing step is then conducted to stress relieve second Cu layer 41. Planarization, as by CMP, is then implemented to remove the overburden of Cu layers 30 and 41 above the upper surface of ILD 12, followed by deposition of a capping layer 50, such as silicon nitride, as shown in FIG. 5. As also shown in FIG. 5, the trenches are filled with stress relieved Cu 51 without voiding, thereby providing lines with reduced electromigration failures.

Figure 6:
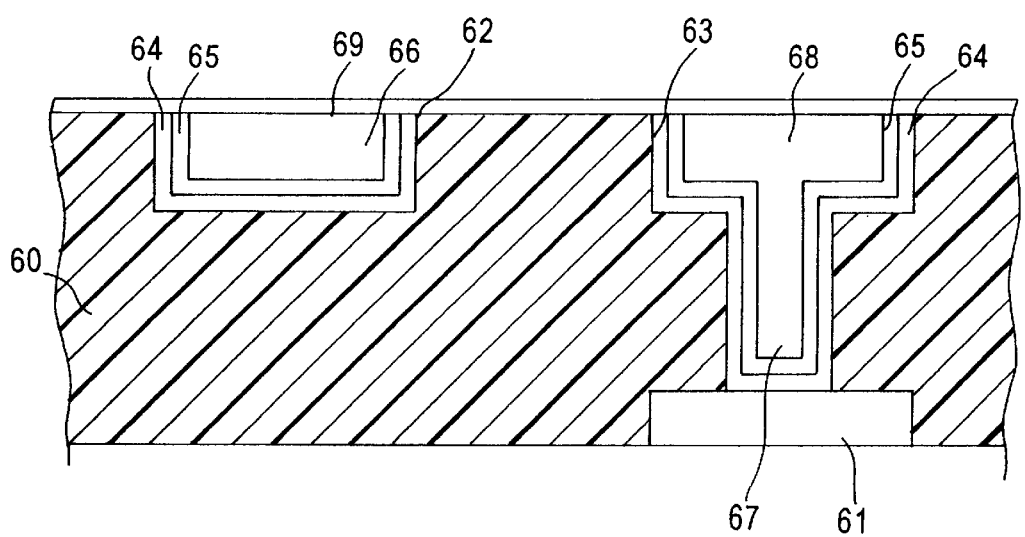
FIG. 6 schematically illustrates another embodiment of the present invention.

Embodiments of the present invention relate to single as well as to dual damascene techniques, the latter involving the formation of a trench in communication with an underlying via opening. An embodiment schematically illustrating both single and dual damascene techniques is shown in FIG. 6. Adverting to FIG. 6, dielectric layer 60, such as a silicon dioxide ILD, is formed over an underlying metal pattern containing metal feature 61. Single damascene trench opening 62 and dual damascene opening 63 are formed in ILD 60. A barrier metal layer 64, such as tantalum or tantalum nitride is initially deposited to line both single damascene opening 62 and dual damascene opening 63. Subsequently, a seedlayer 65 is deposited on barrier metal layer 64. The plural or multi-stage deposition technique of the present invention is then conducted by initially depositing a layer of Cu to partially fill the openings, annealing to effect grain growth of the first deposited Cu, depositing another layer of Cu to completely fill the openings and then annealing the filled openings. The resulting structure would comprise Cu line 66 filling the single damascene opening or trench 62 and dual damascene structure comprising Cu via 67 in communication with Cu line 68 occupying opening 63. As a result of the plural annealings, the filled openings are stress relieved, thereby preventing the generation of voids with an attendant improvement in electromigration resistance. CMP is then conducted followed by deposition of capping layer 69, such as silicon nitride.

Embodiments of the present invention enable fabrication of semiconductor devices with Cu metallization levels comprising lines with substantially no voids or significantly reduced voids with an attendant reduction in electromigration failures The present invention enjoys industrial applicability in manufacturing highly integrated semiconductor devices containing Cu metallization interconnection patterns. The present invention enjoys particular applicability in manufacturing semiconductor devices exhibiting increased circuit speed and sub-micron dimensions, e.g., semiconductor devices having a design rule of about 0.12 micron and under.

In the preceding description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not as restrictive. It is understood that the present invention is capable of using various other combinations and embodiments and is capable of any changes or modifications within the scope of the inventive concept as expressed herein.

What is claimed is:

1. A method of manufacturing a semiconductor device, the method comprising sequentially:

forming a plurality of openings in a dielectric layer;

depositing a layer of metal partially filling the openings;

annealing to effect grain growth of the metal deposited in the openings; and depositing a layer of metal to completely fill the openings.

2. The method according to claim 1, comprising:

depositing a layer of copper (Cu) or Cu alloy as the metal to partially fill the openings; and depositing a layer of Cu or Cu alloy as the metal to completely fill the openings.

3. The method according to claim 2, comprising depositing a barrier layer to line the openings before depositing Cu or a Cu alloy to partially fill the openings.

4. The method according to claim 3, comprising depositing a seedlayer on the barrier layer before depositing the Cu or Cu alloy to partially fill the openings.

5. The method according to claim 3, wherein:

the dielectric layer is an interlayer dielectric (ILD) having an upper surface; and the openings comprise single damascene trenches.

6. The method according to claim 2, further comprising annealing after completely filling the openings with Cu or the Cu alloy.

7. The method according to claim 5, further comprising annealing after completely filling the openings with Cu or the Cu alloy.

8. The method according to claim 7, further comprising:

chemical-mechanical polishing to planarize the upper surface of the ILD exposing the filled trenches; and depositing a capping layer on the filled trenches.

9. The method according to claim 2, comprising depositing Cu or the same Cu alloy when partially filling and when completely filling the openings.

10. The method according to claim 7, wherein the Cu alloy comprises an element selected from the group consisting of tin, zinc, strontium, palladium, magnesium, chromium and tantalum.

11. The method according to claim 2, comprising annealing the partially filled openings at a temperature of about 100° C. to about 450° C.

12. The method according to claim 7, comprising annealing the partially filled trenches and annealing the completely filled trenches at a temperature of about 100° C. to about 450° C.

13. The method according to claim 12, comprising annealing the partially filled trenches and annealing the completely filled trenches in an atmosphere containing nitrogen or a mixture comprising nitrogen and hydrogen.

14. The method according to claim 2, comprising, in the partially filling step, partially filling the openings leaving sufficient empty space in the openings to accommodate grain growth without generating voids.

15. The method according to claim 2, comprising, in the partially filling step, partially filling the openings to about 70% to about 95% of the volume of the openings.

16. The method according to claim 7, comprising, in the partially filling step, partially filling the openings leaving sufficient empty space in the openings to accommodate grain growth without generating voids.

17. The method according to claim 7, comprising, in the partially filling step, partially filling the openings to about 70% to about 95% of the volume of the openings.

18. The method according to claim 4, comprising electroplating to partially fill the openings and to completely fill the openings.

19. The method according to claim 2, wherein at least one of the openings is a dual damascene opening comprising a trench in communication with an underlying via opening.

20. The method according to claim 5, wherein at least one of the openings is a dual damascene opening comprising a trench in communication with an underlying via opening.

* * * * *